(12) United States Patent
McKay

(10) Patent No.: US 9,923,527 B2
(45) Date of Patent: Mar. 20, 2018

(54) METHOD, APPARATUS AND SYSTEM FOR BACK GATE BIASING FOR FD-SOI DEVICES

(71) Applicant: GLOBALFOUNDRIES INC., Grand Cayman (KY)

(72) Inventor: Thomas G. McKay, Boulder Creek, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/148,668

(22) Filed: May 6, 2016

(65) Prior Publication Data
US 2017/0324385 A1 Nov. 9, 2017

(51) Int. Cl.
| | |
|---|---|
| *H01L 27/092* | (2006.01) |
| *H03F 3/193* | (2006.01) |
| *H01L 21/84* | (2006.01) |
| *H03G 1/00* | (2006.01) |
| *H03F 1/02* | (2006.01) |
| *H01L 21/762* | (2006.01) |
| *H01L 29/66* | (2006.01) |
| *H01L 29/78* | (2006.01) |
| *H01L 23/66* | (2006.01) |
| *H01L 27/12* | (2006.01) |

(Continued)

(52) U.S. Cl.
CPC ......... *H03F 3/193* (2013.01); *G06F 17/5045* (2013.01); *H01L 21/67011* (2013.01); *H01L 21/7624* (2013.01); *H01L 21/84* (2013.01); *H01L 23/66* (2013.01); *H01L 27/0928* (2013.01); *H01L 27/1203* (2013.01); *H01L 29/66484* (2013.01); *H01L 29/7831* (2013.01); *H03F 1/0205* (2013.01); *H03G 1/0005* (2013.01); *H01L 21/823828* (2013.01); *H01L 21/823892* (2013.01); *H03F 2200/267* (2013.01); *H03F 2200/451* (2013.01)

(58) Field of Classification Search
CPC .................................................. H01L 27/1203
See application file for complete search history.

(56) References Cited

U.S. PATENT DOCUMENTS

| | | | | |
|---|---|---|---|---|
| 5,892,260 A | * | 4/1999 | Okumura | H01L 27/0218 257/347 |
| 7,180,135 B1 | * | 2/2007 | Ioannou | H01L 29/78648 257/347 |

(Continued)

*Primary Examiner* — Eugene Lee
(74) *Attorney, Agent, or Firm* — Williams Morgan, P.C.

(57) ABSTRACT

At least one method, apparatus and system disclosed involves providing semiconductor device having transistors comprising back gates and front gates. The semiconductor device comprises a signal processing unit for processing an input signal to provide an output signal. The signal processing unit includes a first transistor and a second transistor. The first transistor includes a first back gate electrically coupled to a first front gate. The signal processing unit also includes a second transistor operatively coupled to the first transistor. The second transistor includes a second back gate electrically coupled to a second front gate. The semiconductor device also includes a gain circuit for providing a gain upon the output signal. The semiconductor device also includes a bias circuit to provide a first bias signal to the first back gate and a second bias signal to the second back gate.

11 Claims, 11 Drawing Sheets

(51) Int. Cl.
*H01L 21/67* (2006.01)
*G06F 17/50* (2006.01)
*H01L 21/8238* (2006.01)

(56) References Cited

U.S. PATENT DOCUMENTS

| | | | | |
|---|---|---|---|---|
| 7,479,418 B2* | 1/2009 | Cai | ............... | H01L 21/84 |
| | | | | 257/E21.415 |
| 7,940,085 B2* | 5/2011 | Kim | ............... | H01L 27/0883 |
| | | | | 326/26 |
| 8,131,225 B2* | 3/2012 | Botula | ............ | H01L 27/1203 |
| | | | | 257/349 |
| 8,194,487 B2* | 6/2012 | Carman | ........... | G11C 11/406 |
| | | | | 365/177 |
| 8,384,156 B2* | 2/2013 | Ma | ............... | H01L 21/84 |
| | | | | 257/324 |
| 8,415,743 B2* | 4/2013 | Cai | ............... | H01L 27/1203 |
| | | | | 257/348 |
| 8,552,500 B2* | 10/2013 | Dennard | .......... | H01L 21/84 |
| | | | | 257/349 |
| 9,390,786 B2* | 7/2016 | Lecocq | | |
| 2004/0262693 A1* | 12/2004 | Ohsawa | ........... | H01L 27/1203 |
| | | | | 257/369 |
| 2009/0026542 A1* | 1/2009 | Wahl | ............. | H01L 21/84 |
| | | | | 257/350 |
| 2009/0101940 A1* | 4/2009 | Barrows | .......... | H03K 19/1778 |
| | | | | 257/204 |
| 2013/0082780 A1* | 4/2013 | Kummaraguntla | ...... | H03G 3/30 |
| | | | | 330/279 |
| 2013/0140442 A1* | 6/2013 | Yanagita | ......... | H01L 31/08 |
| | | | | 250/214 A |
| 2013/0175594 A1* | 7/2013 | Basker | ........... | H01L 21/84 |
| | | | | 257/301 |

* cited by examiner

METHOD, APPARATUS AND SYSTEM FOR BACK GATE BIASING FOR FD-SOI DEVICES

FIELD OF THE INVENTION

Generally, the present disclosure relates to the manufacture of sophisticated semiconductor devices, and, more specifically, to employing back gate biasing for a FD-SOI device.

DESCRIPTION OF THE RELATED ART

There is an ever-growing demand for integrated circuit devices (e.g., radio-frequency (RF) devices, system on chips that include digital and analog functionality, e.g., RF and/or other analog functionality, etc.) that provide more efficient operations. Therefore, designers are constantly attempting to improve semiconductor processing to manufacture better integrated circuit devices. The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a plurality of process technologies are currently practiced, wherein, for many types of complex circuitry, including field effect transistors, MOS technology is currently among the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. During fabrication of N-channel MOS (NMOS) devices and/or P-channel MOS (PMOS) devices, designers often control process steps to allow for increase current drive of those devices. For NMOS devices, the flow of electrons may be enhanced for increased current drive. For PMOS devices, the flow of "holes" may be enhanced for increased current drive. For example, a strained silicon layer is often formed to provide for improved transport of charge particles (i.e., electrons or holes).

There is a growing consensus in the industry that traditional methodology must be improved upon to provide smaller devices and devices that can operate at lower voltages. Currently, so-called bulk FETs are one of the more popular designs implemented in many devices. FIG. 1 illustrates a stylized depiction of a typical bulk FET 100 formed on a semiconductor wafer. The FET 100 is formed on a silicon substrate 105. An inversion layer 150 is formed on the silicon substrate 105. The inversion layer 150 is generally formed by depositing silicon oxide. A gate 110 is formed on the substrate 105, surrounded by insulation 120 formed during the processing of the wafer, which may be comprised of $HfO_2$.

A gate oxide layer 125 is formed over the inversion layer 150. The gate 120 of the FET 100 is formed over the gate oxide layer 125. FIG. 1 also illustrates the source region 140 and the drain region 130, which are formed at the top portion of the substrate 105. If the substrate 105 is of N-type, the drain and source regions 130, 140 would be of P-type, and vice versa. In this configuration, a depletion region 160 is created below the source region 140 and the drain region 130.

One of the problems associated with the typical bulk FET design of FIG. 1 includes the fact that these types of FETs can exhibit significantly reduced output resistance due to poor carrier confinement, leading to lower voltage gain and low power efficiency. Further, due to the depletion region 160, current leakage may occur even when the FET 100 is off. Current leakage may include drain leakage current, source leakage current, and well leakage current. The FET 100 also tends to have a relatively high threshold voltage. Moreover, when supply voltage is reduced in order to decrease power consumption, the typical bulk FET design of FIG. 1 tends to exhibit performance degradation.

Designers have suggested utilizing the so-called silicon-on-insulator (SOI) design to address some of the deficiencies and problems exhibited by the typical bulk FET design of FIG. 1. SOI transistors are generally formed in thin layers of silicon that are isolated from the main substrate of a semiconductor wafer by using an electrical insulator, such silicon dioxide. The thin silicon layers may have thicknesses that range from several microns (typically for electrical power switching devices) down to less than 500 Å (typically for high-performance microprocessors). The isolation properties conferred by SOI designs provides for a reduction in the current leakage. SOI designs can provide other advantages such as faster operation of circuits and lower operating voltages. FIG. 2 illustrates a stylized depiction of a typical fully depleted (FD) SOI FET 200 formed on a semiconductor wafer.

The FD-SOI FET 200 is formed on a silicon substrate 205. The FET 200 comprises a depletion region 250 formed by depositing silicon oxide. A gate 200 is formed on the substrate 205, surrounded by insulation 220 formed during the processing of the wafer, and is generally comprised of $HfO_2$.

A gate oxide layer 225 is formed over substrate 205. The gate 220 of the FET 220 is formed over the gate oxide layer 225. The FET 200 also comprises a source region 240 and the drain region 240, which are formed at the top of the substrate 105. If the substrate 205 is of N-type, the drain and source regions 230, 240 would be of P-type, and vice versa. Further, the FET 200 comprises a buried oxide (BOX) region 270 below the drain and source regions 230, 240.

In this configuration, instead of a large depletion region 160 of FIG. 1, the depletion region 250 is confined above the BOX region 270 and between the drain and source regions 230, 240. The BOX region 270 is formed below the source region 140, the drain region 130 and the depletion region 250. The position of the BOX region 270 prevents the formation of a large depletion region similar to the depletion region 160 of FIG. 1. Further, the depletion region 250, in this case, is fully depleted. If the drain and source regions 230, 240 are of P-type, the depletion region 250 would be an N-type depleted region, and vice versa.

One issue of concern with regard to FD-SOI devices is biasing issues in high-frequency applications. Using state of the art designs, biasing applied in FD-SOI devices may cause parasitic capacitance problems. FIG. 3 illustrates a typical high-gain biasing for a high-frequency application of FD-SOI devices. FIG. 3 shows a circuit 300 that represents a conventional bias network for allowing operation and high transconductance-current ratio (gm/I) and high transconductance-channel conductance ratio (gm/gds). The circuit 300 represents a either a bulk transistor circuit or a finFET circuit.

FIG. 3 illustrates a circuit 300 that is capable of providing a gain on an high frequency (i.e., radio frequency (RF)) input signal RFin (350) to provide an amplified RF output, RFout (360. The circuit includes a PFET 310 and an NFET 320 connected via their drain nodes. An input voltage Vgp is provided to the gate of the PFET 310 via a resistor R3 (334), while an input voltage Vgn is provided to the gate of the NFET 320 via a resistor R2 (333). The resistors R2 333 and R3 334 are large value resistors to apply DC bias and separate the DC circuit from the RF circuit. The circuit 300 also comprises capacitors C4 (370) and C5 (372) that are designed to provide DC blocking/AC coupling. The circuit 300 also comprises a resistor R1 (320) to provide negative feedback from the output signal RFout 360 to the input signal RFin 350 for DC and RF signals Designers have implemented this design to achieve Class AB operation to realize lower current draw and use DC biasing to be able to react to small signals.

However, among the problems associated with the conventional design of the circuit 300 includes the fact this bias circuit designed to optimize gain and gain efficiency tends to increase signal path parasitic capacitance. The capacitors C1 340, C2 342, and C3 344 represent parasitic capacitances at various locations in the circuit 300. The parasitic capacitors C1 340, C2 342, and C3 344 are coupled to the substrate. Part of the reason for the existence of the parasitic capacitances is the presence of the AC coupling capacitors.

Ideally, it is desired that the current in the input signal RFin 350 to travel through the transistors, and the voltage on the RFout signal to be at mid-level so that it can swing about the quiescent point. However, due to the existence of parasitic capacitances, portions of the current in the input signal RFin 350 may travel through the parasitic capacitances C1 340, C2 342, and C3 344, which may result in undesirable power consumption and reduced signal bandwidth. Further, the parasitic capacitances may cause performance degradation. Also, the AC coupling capacitors tend to be large and use up valuable die real estate and increase production costs.

The present disclosure may address and/or at least reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to at least one method, apparatus and system disclosed involves a semiconductor device having transistors that comprises back gates and front gates. The semiconductor device comprises a signal processing unit for processing an input signal to provide an output signal. The signal processing unit includes a first transistor and a second transistor. The first transistor includes a first back gate electrically coupled to a first front gate. The signal processing unit also includes a second transistor operatively coupled to the first transistor. The second transistor includes a second back gate electrically coupled to a second front gate. The semiconductor device also includes a gain circuit for providing a gain upon the output signal. The semiconductor device also includes a bias circuit to provide a first bias signal to the first back gate and a second bias signal to the second back gate.

BRIEF DESCRIPTION OF THE DRAWINGS

The disclosure may be understood by reference to the following description taken in conjunction with the accompanying drawings, in which like reference numerals identify like elements, and in which.

Figure 1:
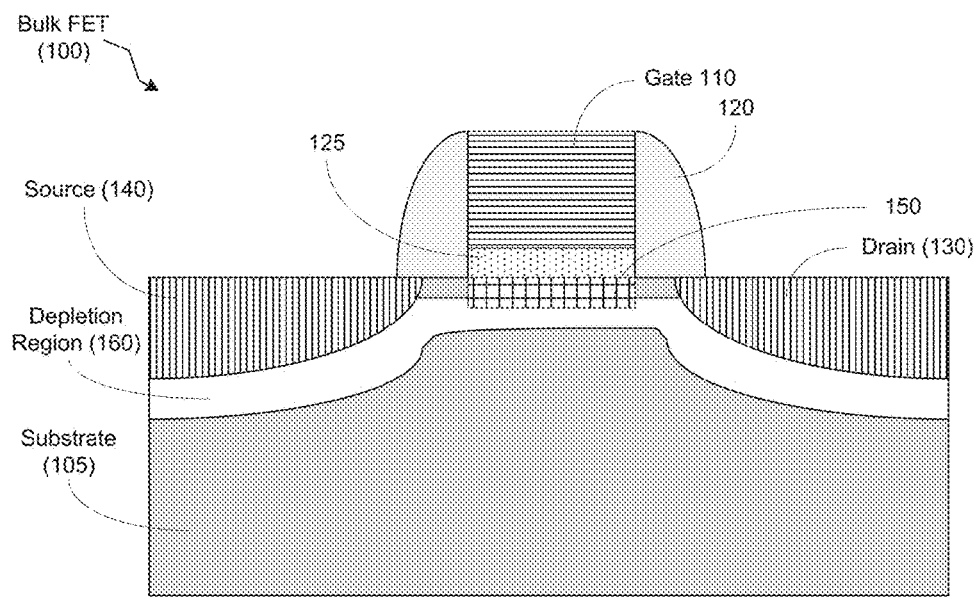
FIG. 1 illustrates a stylized depiction of a typical bulk FET formed on a semiconductor wafer.
Figure 2:
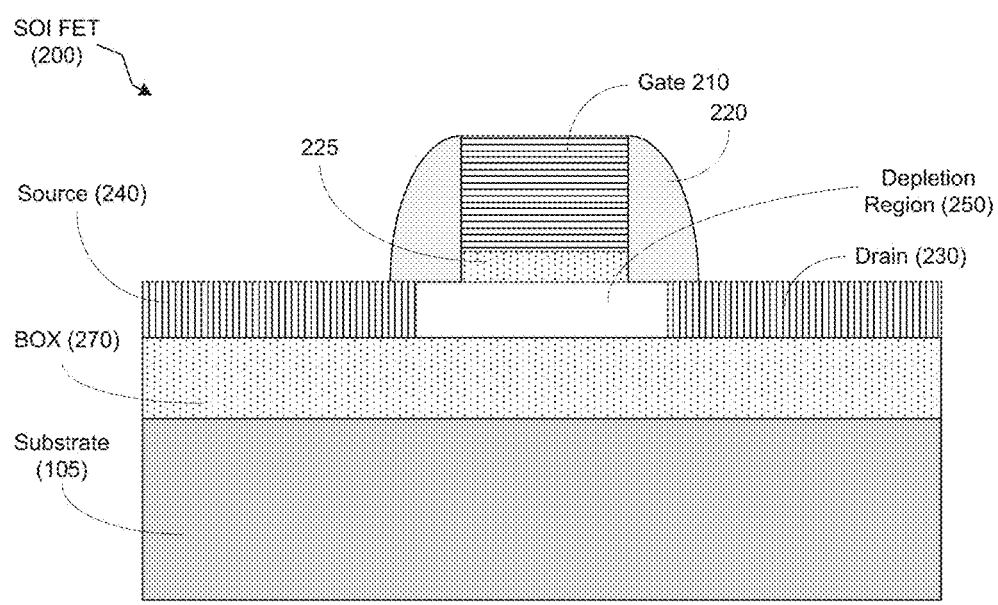
FIG. 2 illustrates a stylized depiction of a typical fully depleted (FD) SOI FET formed on a semiconductor wafer.
Figure 3:
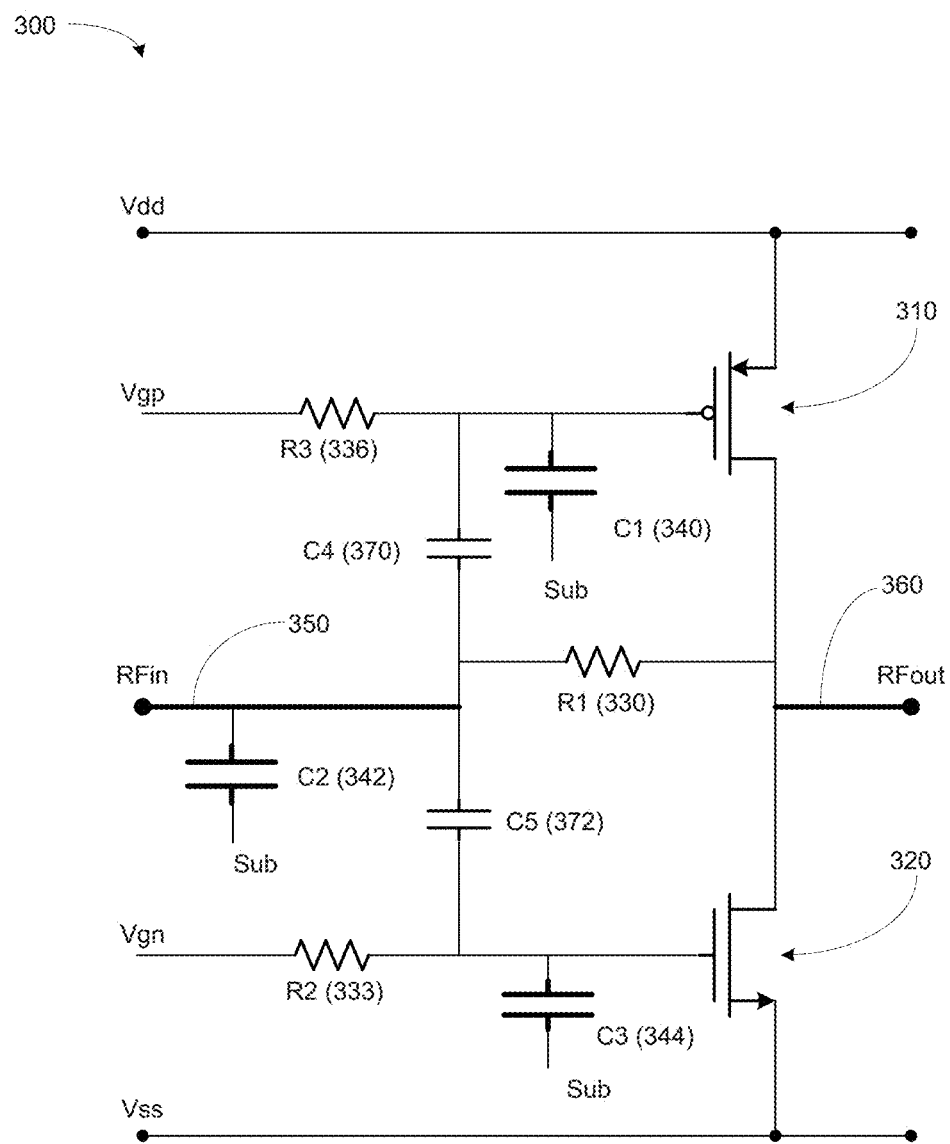
FIG. 3 illustrates a stylized depiction a typical high gain biasing circuit for a high-frequency application of FDSOI devices.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification.

It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Embodiments herein provide for fabricating high-frequency circuits comprising NMOS and/or PMOS devices, such as FDSOI transistors, e.g., 22FDSOI transistors. Embodiments herein provide for utilizing a back gate design for affecting the operations of a front gate circuit of a transistor. This concept may be applied to various types of circuit, such as high-frequency applications, including radio-frequency (RF) applications.

Some embodiments herein are directed to back gate design for controlling the voltages of one or more front gates using a bias circuit. For example, the front gate voltage may be changed to a fraction of the Vdd voltage (e.g., Vdd/2). In some embodiments, a back gate may be used to change the threshold voltage of a front gate. The bias circuitry in conjunction with one or more back gates may provide various advantages, such as reducing or eliminating usage of AC coupling capacitors, which may provide for a reduction in die-area usage, lowering of production costs, and improvement of circuit performance.

Embodiments herein provide for setting the current density of a front gate circuit to a predetermined level using a back gate design. The back gate voltage may be set to a negative predetermined level for NMOS circuits, or set to a positive predetermined level for PMOS circuits. In one embodiment, a reverse back gate bias may be implemented to achieve higher gain (i.e., transconductance [gm]*load resistance [rd]). In some embodiments, a forward back gate bias may be implemented to achieve a reduction in supply voltage (Vdd) operation. PMOS back gate biasing may be used to drive the voltage to a predetermined voltage (e.g., Vdd/2) using a negative feedback loop.

Some advantages of embodiments herein include eliminating or substantially reducing usage of AC coupling caps. Further, parasitic capacitances may be reduced by embodiments herein. Source and drain capacitances may be reduced, providing for faster rise and fall time for wave shaping. Using reverse biasing using embodiments herein my provide for substantially reducing or eliminating signal path losses at high gain and gain efficiency (gm/I). Further, using forward biasing in embodiments herein may provide for reducing the threshold voltage of a transistor, and in some cases reducing the threshold voltage to near or at zero. This may provide for a substantially constant gm over near rail-to-rail input voltage range. The highest fT may be realized at the threshold voltage of zero Volts.

Figure 4:
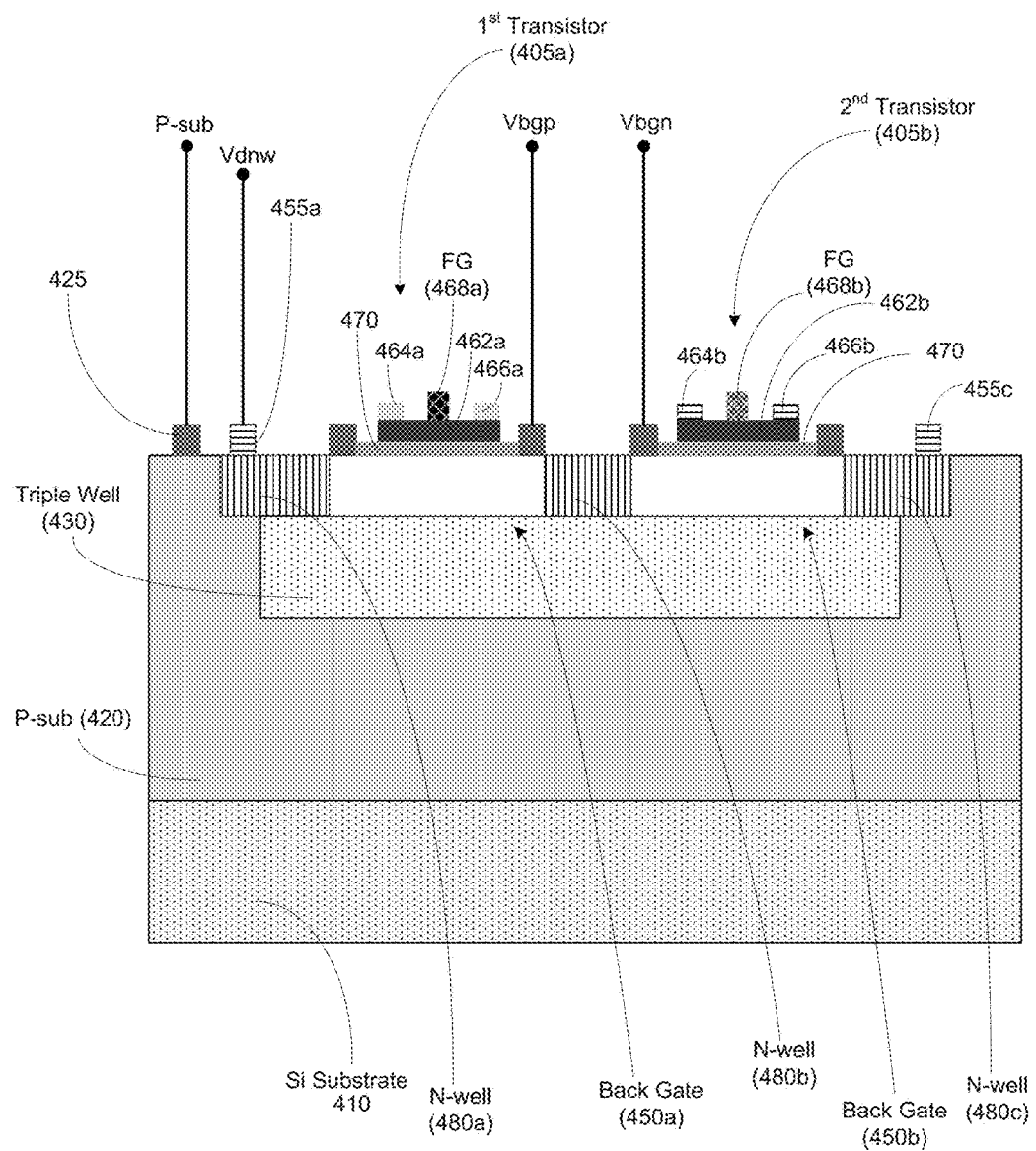
FIG. 4 illustrates a stylized diagram of a cross-sectional view of an integrated circuit comprising transistors each front gate and a back gate, in accordance with embodiments herein.

Turning now to FIG. 4, a stylized diagram of a cross-sectional view of an integrated circuit comprising transistors each having a front gate and a back gate, in accordance with embodiments herein is illustrated. A silicon substrate layer 410 is prepared for depositing various layers for forming an FD-SOI device. A P-substrate layer 420 is formed above the silicon substrate 410. A P-sub terminal 425 comprised of P+ dopant material is formed over a portion of the P-substrate layer such that the P-sub terminal 425 is operatively coupled to the P-substrate layer 420.

A triple-well layer 430 is formed above the P-substrate layer 420. A plurality of P-well structures are formed for defining a plurality of back gates 450*a* and 450*b*. The triple-well layer 430 provides for a buried N-well layer that isolates the P-well of the back gates 450*a* and 450*b* from the P-substrate layer 420, thereby reducing substrate noise coupling. Further, N-well regions 480*a*, 480*b*, and 480*c* are formed above the triple-well layer 430, isolating the back gates 450*a* and 450*b*. An N+ node 455*a* is formed over the N-well region 480*a*, and an N+ node 455*c* is formed over the N-well region 480*c*.

An oxide layer (e.g., $SiO_2$) 470 is formed over each of the back gates 450*a*, 450*b*. A first front gate 468*a* is formed over the back gate 450*a*, and a second front gate 468*b* is formed over the back gate 450*b*. The back gate 450*a* and the front gate 468*a* are components of a $1^{st}$ transistor 405*a*, wherein the back gate 450*b* and the front gate 468*b* are components of a $2^{nd}$ transistor 405*b*.

The $1^{st}$ transistor 405*a* comprises a gate 468*a*, a source 464*a*, and a drain 466*a* that are formed on an silicon-on-insulator (SOI) formation 462*a*. The $2^{nd}$ transistor 405*b* comprises a gate 468*b*, a source 464*b*, and a drain 466*b* that are formed on an SOI formation 462*b*. A back gate voltage (described in further details below), Vbgp is provided to the back gate 450*a*, and a back gate voltage, Vbgn is provided to the back gate 450*b*. The device illustrated in FIG. 4 provides a back gate/front gate design, wherein the back gates 450*a*, 450*b* are respectively capable of affecting the threshold, operating voltage, and/or the current densities of the front gates 468*a*, 468*b* of the $1^{st}$ and $2^{nd}$ transistors 405*a*, 405*b*, as described in further details below.

Figure 5:
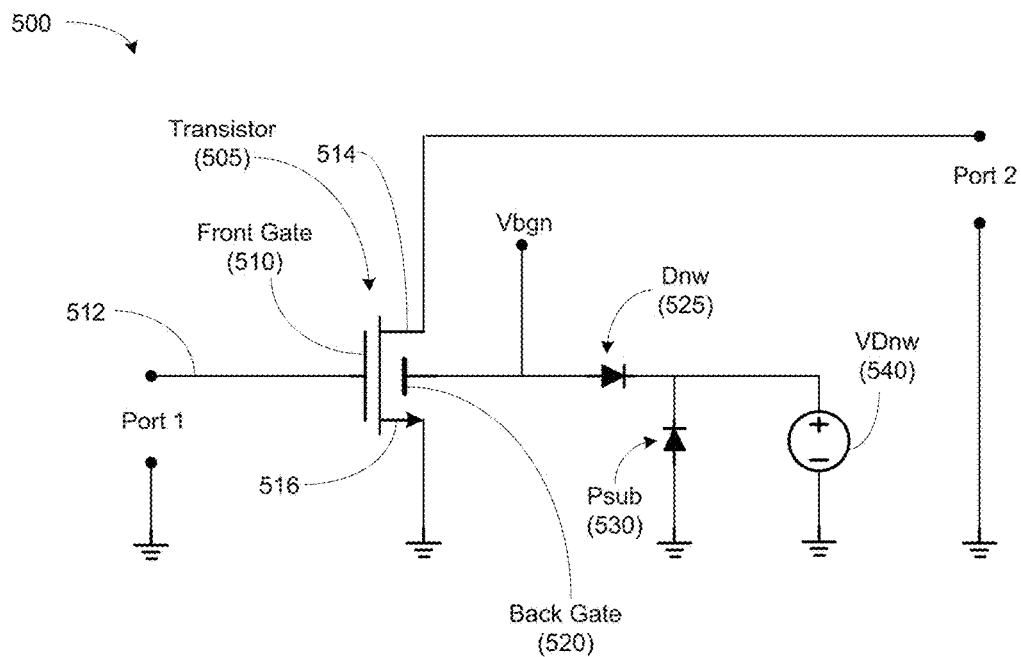
FIG. 5 illustrates a stylized schematic representation of an undoped NMOS device in a triple well transistor design that comprises a back gate and a front gate, in accordance with embodiments herein.

Turning now to FIG. 5, a stylized schematic representation of an undoped NMOS device in a triple well transistor design that comprises a back gate and a front gate, in accordance with embodiments herein is illustrated. The device 500 of FIG. 5 comprises a transistor 505 comprising a front gate 510 and a back gate 520. A first port 512 provides an input voltage to the front gate 510. A back gate voltage, Vbgn is provided to the back gate 520. The source 516 of the transistor 505 is coupled to ground, while the drain 514 is coupled to a $2^{nd}$ port. An N-well of the device 505 provides an equivalent diode 525, wherein the P-substrate portion of the device 505 provides an equivalent diode 530.

The circuit of the device 500 provides for a two-port s-par between the front gate 510 and the drain 514, while the source 516 is grounded. In some embodiments, the DC bias for the input gate voltage 512 and the drain voltage may be fixed to a fraction of Vdd, e.g., Vdd/2. The drain-source current (Ids) may be controlled by adjusting the back gate voltage level, Vbgn.

For reverse biasing, the back gate bias voltage may be swept from 0 Volts to a negative voltage (e.g., −5 Volts). For forward biasing, the back gate voltage may be set to a positive value (e.g., +5 Volts, +4 Volts, +3 Volts, +2 Volts, etc.). The back gate 520 may be used to affect the threshold, operating voltage, and/or the current densities of the front gate 510.

Figure 6:
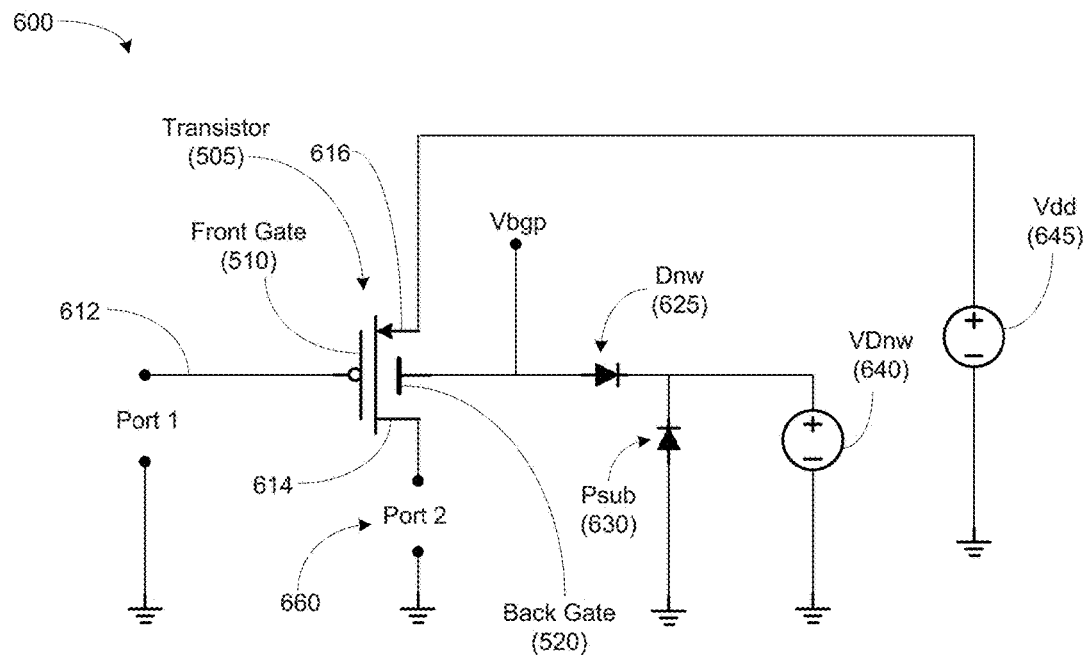
FIG. 6 illustrates a stylized schematic representation of an undoped PMOS device in a triple well transistor design that comprises a back gate and a front gate, in accordance with embodiments herein.

Turning now to FIG. 6, a stylized schematic representation of an undoped PMOS device in a triple well transistor design that comprises a back gate and a front gate, in accordance with embodiments herein is illustrated. The device 605 of FIG. 6 comprises a transistor 605 comprising a front gate 610 and a back gate 620. A first port 612 provides an input voltage to the front gate 610. A back gate voltage, Vbgp is provided to the back gate 620. The source 616 of the transistor 605 is coupled to Vdd 645, while the drain 614 is coupled to a $2^{nd}$ port 660. An N-well of the device 605 provides an equivalent diode 625, wherein the P-substrate portion of the device 605 provides an equivalent diode 630, which has an N-well voltage. The diodes 630, 625 are coupled to a node representative of a N-well diode voltage source 640.

The circuit of the device 600 provides for a two-port s-par between the front gate 610 and the drain 614 at Vdd, with the source 610 at Vdd, and AC components being grounded. The gm, gd, fT, and fmax may be defined using the first and second ports 612, 660. In some embodiments, the DC bias for the input gate voltage 612 and the drain voltage may be fixed to a fraction of Vdd, e.g., Vdd/2. The drain-source current (Ids) may be controlled by adjusting the back gate voltage level, Vbgn.

For reverse biasing, the back gate bias voltage may be swept from 0 Volts to a positive voltage (e.g., +5 Volts). For forward biasing, the back gate voltage may be set to a negative value (e.g., −5 Volts, −4 Volts, −3 Volts, −2 Volts, etc.). The back gate 620 may be used to affect the threshold, operating voltage, and/or the current densities of the front gate 610.

Figure 7A:
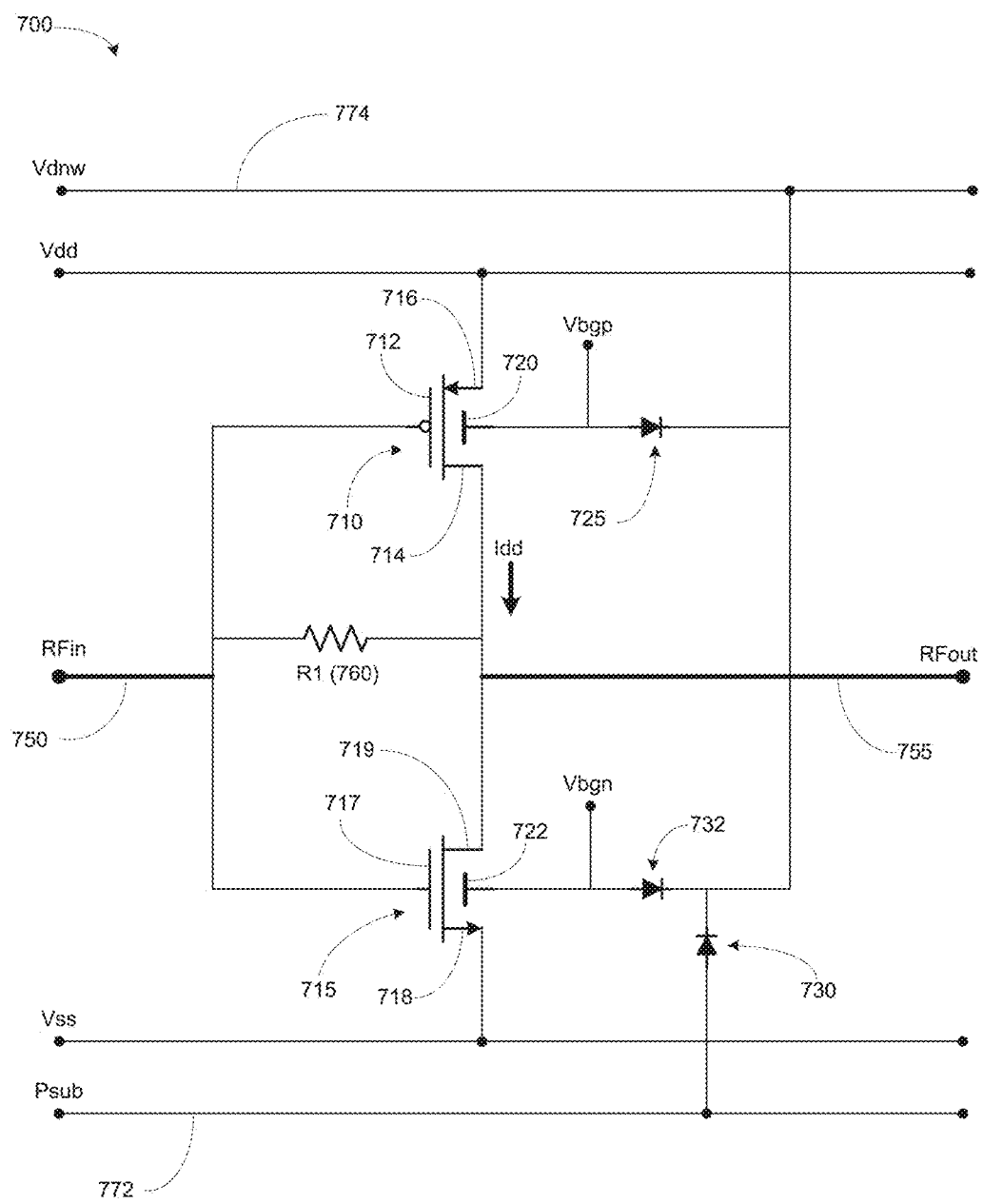
FIG. 7A illustrates a stylized schematic representation of a high gain-high efficiency (HGGE) core circuit, in accordance with a first embodiment herein.
Figure 7B:
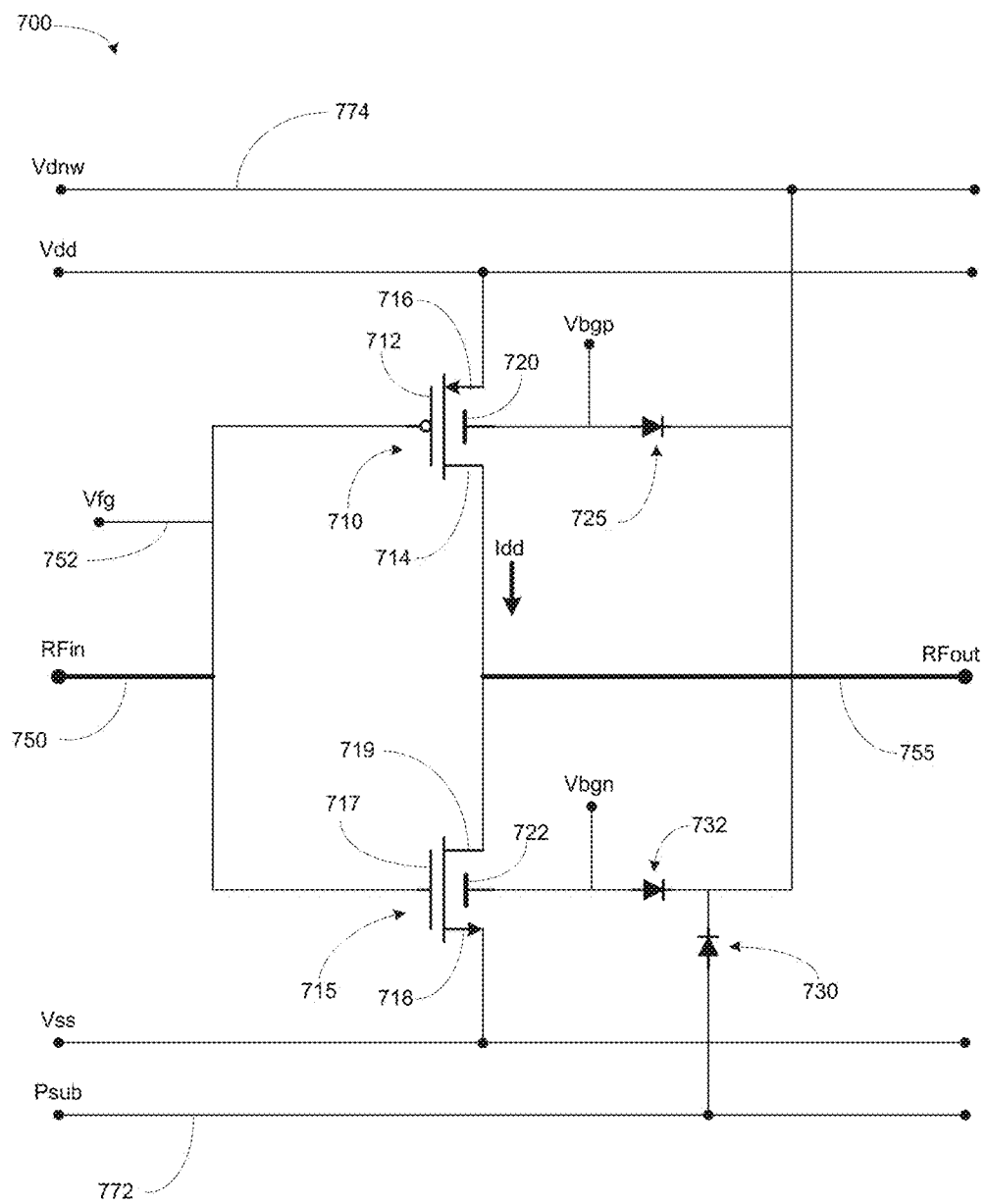
FIG. 7B illustrates a stylized schematic representation of a high gain-high efficiency (HGGE) core circuit, in accordance with a second embodiment herein.

Turning now to FIGS. 7A and 7B, FIG. 7A illustrates a stylized schematic representation of a high gain-high efficiency (HGGE) core circuit, in accordance with a first embodiment. FIG. 7B illustrates a similar circuit as in FIG. 7A, in accordance with a second embodiment. Referring simultaneously to FIGS. 7A and 7B, a circuit 700 comprises a PMOS transistor 710 and an NMOS transistor 715. The PMOS transistor 710 comprises a front gate 712 and a back gate 720. An input node RFin 750 may provide a high-frequency input voltage to the front gate 712 of the PMOS transistor 710, and to the front gate 717 of the NMOS transistor 715. A resistor R1 760 is coupled to the RFin signal and to an output node 755, which carries the output signal RFout.

The transistors 710 comprise a back gate 720 and the transistor 715 comprises a back gate 722. A back gate voltage, Vbgp is provided to the back gate 720 of the PMOS transistor 710. A back gate voltage, Vbgn is provided to the back gate 722 of the NMOS transistor 715. The source 716 of the PMOS transistor 710 is coupled to Vdd, while the drain 714 is coupled to the drain 719 of the NMOS transistor 715. The source 718 of the NMOS transistor is coupled to Vss.

An N-well of the device 700 provides an equivalent diode 725 and an equivalent diode 732, which are coupled to an N-well voltage 774. The P-substrate portion of the device 700 provides an equivalent diode 730, which is coupled to an P-substrate voltage 772. In some embodiments, the DC bias for the input gate voltage at node 750 may be fixed to a fraction of Vdd, e.g., Vdd/2. The drain-drain current (Idd) may be controlled by adjusting the back gate voltages Vbgp and Vbgn.

The back gates 720 and 722 may be used to affect the threshold, operating voltage, and/or the current densities of the front gates 712, 717 of the PMOS and NMOS transistors 710, 715. The biasing of the transistors 710, 715 provided by the back gates 720 and 722 provides for high-gain and gain efficiency operations, while substantially reducing or eliminating signal path losses.

FIG. 7B is similar to FIG. 7A, except that the resistor R1 760, which is coupled to the RFin signal and to an output node 755, is missing in FIG. 7B. Further, the front gates 710, 715 of FIG. 7B are coupled to a DC couple signal (Vfg 752), which may be coupled to a previous amplifier stage or to a separate bias setting circuitry. In this circuit (of FIG. 7B), the front gate input voltages are determined by the previous amplifier stage or the separate bias setting circuitry, wherein the output voltages are determined by the back gate biasing provided by embodiments herein.

Figure 8:
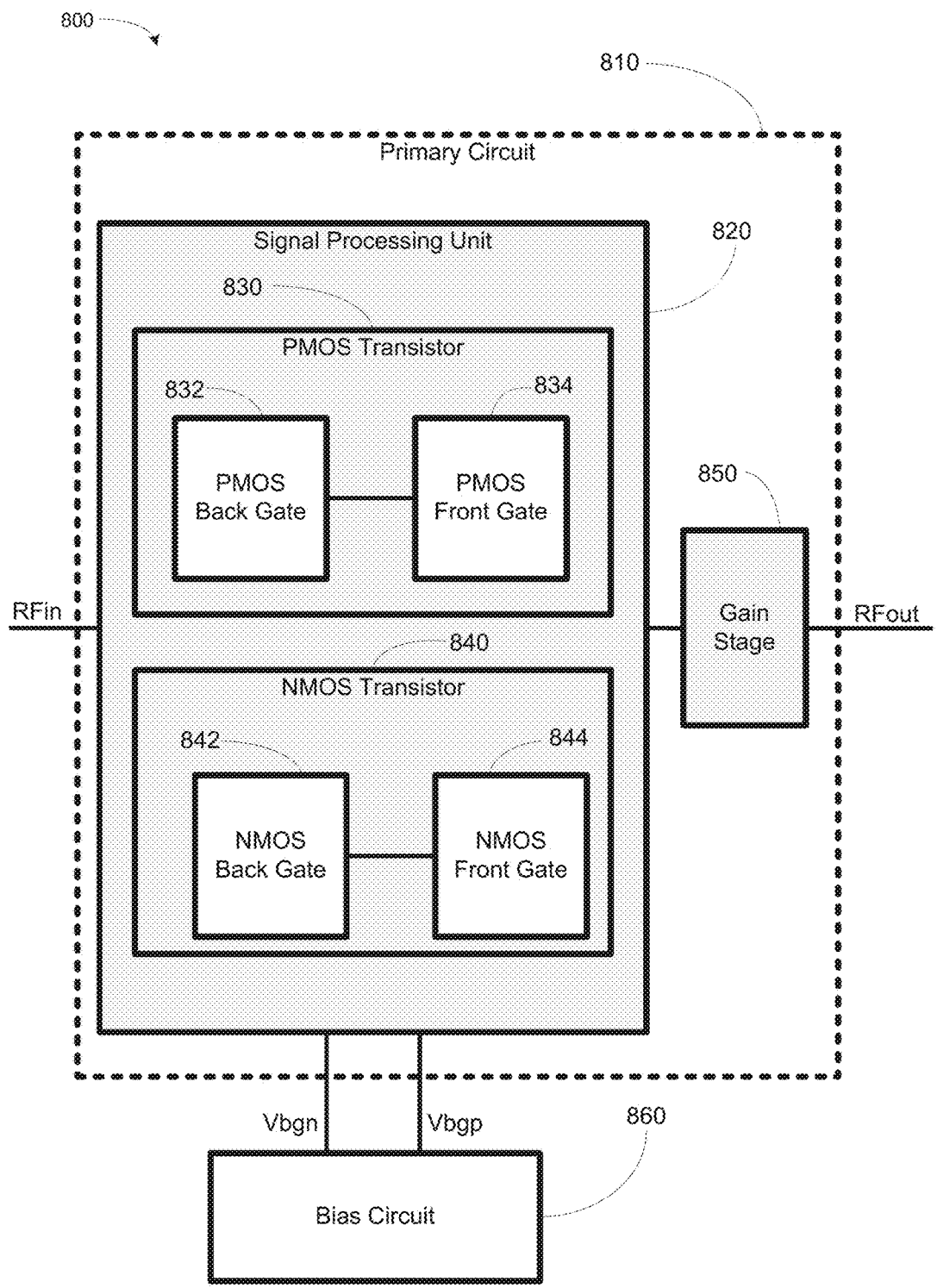
FIG. 8 illustrates a stylized block diagram representation of a primary circuit comprising transistors having front gates and back gates coupled to a bias circuit for biasing the back gates, in accordance with embodiments herein.

Turning now to FIG. 8, a stylized block diagram representation of a primary circuit comprising transistors having front gates and back gates coupled to a bias circuit for biasing the back gates, in accordance with embodiments herein is illustrated. A device 800 (e.g., a high-frequency RF device) may comprise primary circuit 810 and a bias circuit 860. The primary circuit 810 may comprise an signal processing unit 820 (e.g., an RF signal processing unit), which is capable of processing an input signal (e.g., a high-frequency signal), RFin, and providing an output signal RFout.

The signal processing unit 820 may comprise a PMOS transistor 830 and an NMOS transistor 840. The transistors 830, 840 may be FD-SOI devices. The PMOS transistor 830 comprises a back gate 832 and a front gate 834. The NMOS transistor 840 comprises a back gate 842 and a front gate 844.

The back gates 832, 842 may be coupled to the bias circuit 860, which provides a bias voltage signal to each of the back gates 832, 842. Similar to the circuit exemplified in FIG. 7, the back gate 832 receives the biasing voltage signal Vbgp, and the back gate 842 receives the biasing voltage signal, Vbgn from the bias circuit 860. The biasing voltage signals Vbgp and Vbgn, via the back gates 832, 842, may be used to control the thresholds, operating voltages, and/or the current densities of the front gates 834, 844. The output from the signal processing unit 820 may be provided to a gain state 850, which may buffer and/or amplify the input signal (e.g., RF signal) to provide the high-frequency output signal, RFout. A more detailed description of the bias circuit 860 is provided in FIG. 9 and accompanying description below.

Figure 9:
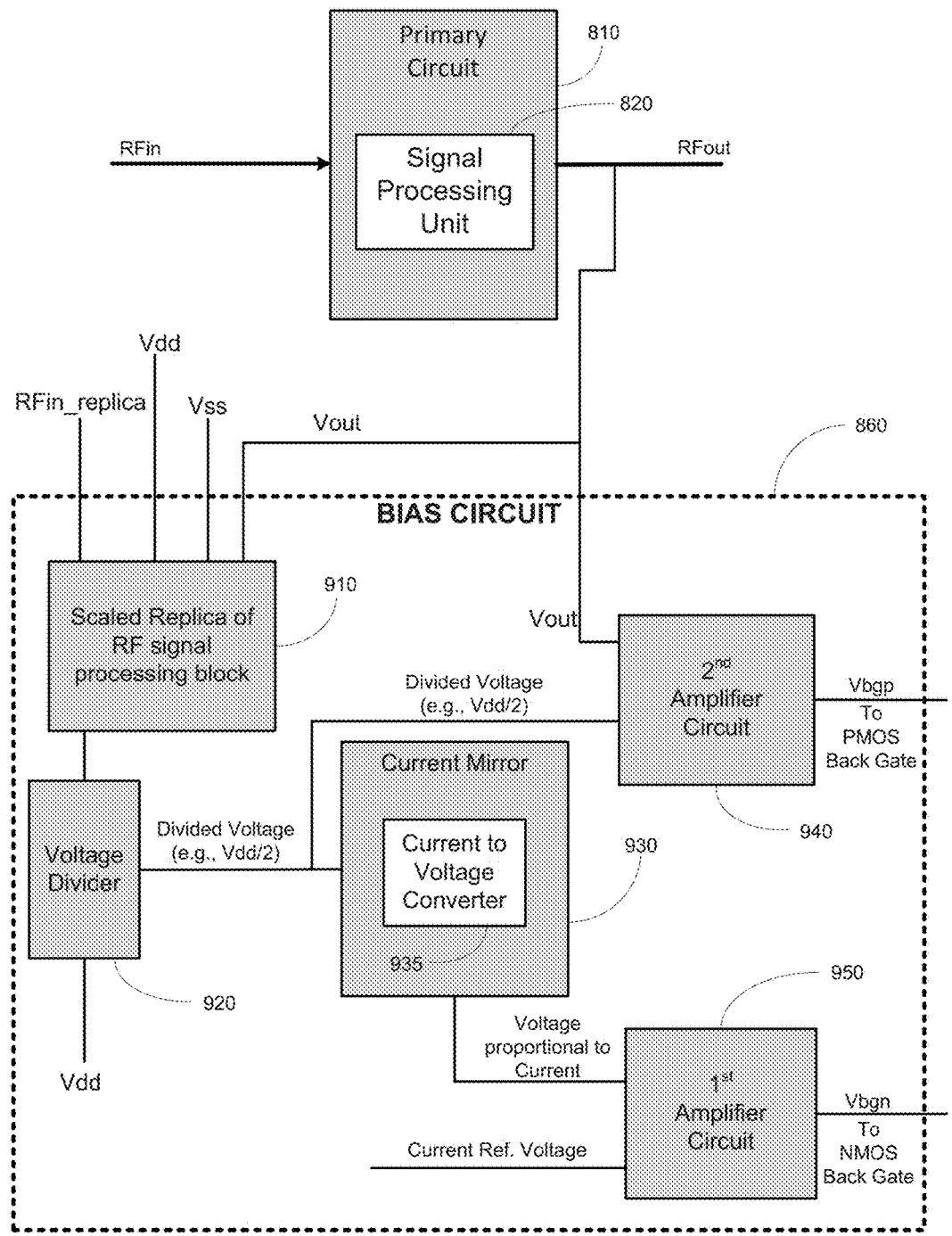
FIG. 9 illustrates a stylized block diagram description of the bias circuit of FIG. 8, in accordance with embodiments herein.

Turning now to FIG. 9, a stylized block diagram description of the bias circuit of FIG. 8, in accordance with embodiments herein, is illustrated. The bias circuit 860 may comprise a scaled replica of the signal processing block 910, matching the signal processing unit 820 of the primary circuit 810. A voltage divider 920 is used to divide the voltage level of Vdd to a fraction of Vdd (e.g., Vdd/2). The divided voltage is provided to a current mirror circuit 930. The current mirror 930 may comprise a current to voltage converter 935.

The output from the current mirror is a voltage proportional to the current of the current mirror 930. This voltage is provided to a 1st amplifier circuit 950. The 1st amplifier circuit 950 also receives a predetermined current reference voltage. Based on the inputs, the voltage proportional to the current from the current mirror 960 and the current reference voltage, the 1st amplifier circuit 950 produces the bias signal, Vbgn.

Further, the divided voltage signal (e.g., Vdd/2) from the voltage divider 920 is provided to a 2nd amplifier circuit 940. The voltage signal from RFout is also provided to the 2nd amplifier circuit 940. Based on the inputs, the divided voltage signal and the voltage signal from RFout, the 2nd amplifier circuit 940 produces the bias signal, Vbgp. The bias signals Vbgp and Vbgn are provided to the back gates of the RF transistors in the signal processing unit 820. More detailed descriptions of the $1^{st}$ and $2^{nd}$ amplifier circuits are respectively provided FIGS. 10 and 11 and accompanying descriptions below.

In one embodiment, the bandwidth of the amplifier circuits 940, 950 may be limited to below the RF passband. This limitation may be accomplished in a number of ways that are known to those skilled in the art having benefit of the present disclosure. For example, using an RC filter circuit), limiting the bandwidth of the amplifiers (e.g., op amps) in the amplifier circuits 940, 950, providing an op-amp feedback RC filtering, input filtering, and/or using other means known to those skilled in the art having benefit of the present disclosure.

Figure 10:
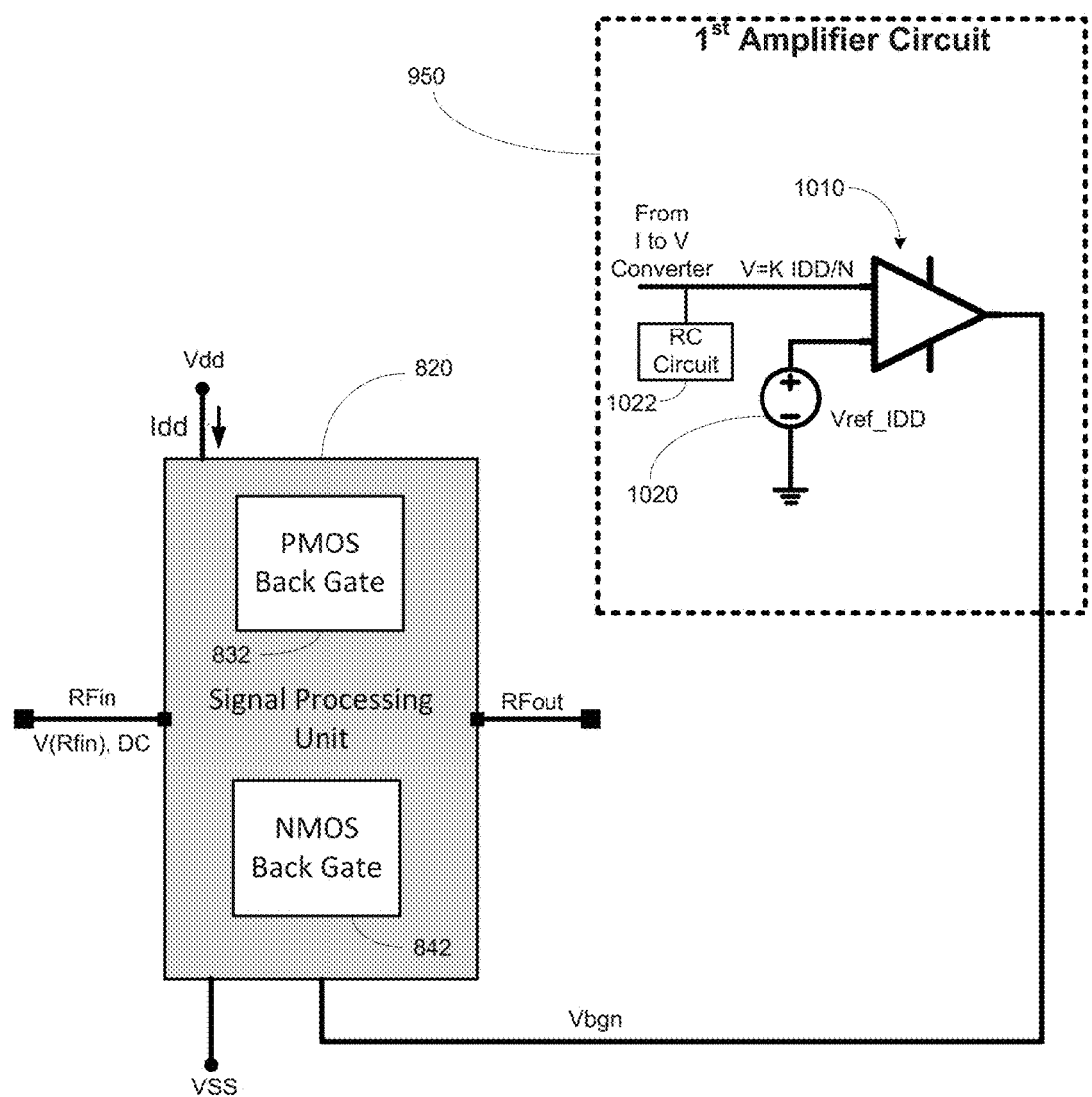
FIG. 10 illustrates a stylized block diagram of the $1^{st}$ amplifier circuit of FIG. 9, in accordance with embodiments herein.

Turning now to FIG. 10, a stylized block diagram of the $1^{st}$ amplifier circuit of FIG. 9, in accordance with embodiments herein, is illustrated. The $1^{st}$ amplifier circuit 860 comprises an amplifier 1010, which receives the output from the current to voltage converter 935, wherein this voltage signal is proportional to Idd or a fraction of Idd. This voltage signal, along with the a current reference voltage signal, represented by the voltage source 1020 is provided to the inputs of the amplifier 1010. The amplifier 1010 may be a negative feedback circuit, gain element, or operation amplifier (op amp). The output signal, Vbgn from the amplifier device 1010 has a unity gain bandwidth (UGBW) that is significantly less that the frequency of the input signal, RFin. The output signal (Vbgn), which is a bias signal for the NMOS transistor 840, is provided to the NMOS back gate 842.

In one embodiment, the input (V=K Idd/N) to the amplifier 1010 may also comprise an RC circuit 1022 to control the bandwidth of the amplifier circuit 950. In one embodiment, the bandwidth of the amplifier circuit 950 may be limited to below the RF passband. This limitation may be accomplished in a number of ways that are known to those skilled in the art having benefit of the present disclosure. For example, an RC circuit 1022 may be used (e.g., similar to that shown in FIG. 11), limiting the bandwidth of the amplifier 1010 itself, providing an op-amp feedback RC filtering, input filtering, and/or using other means known to those skilled in the art having benefit of the present disclosure.

Figure 11:
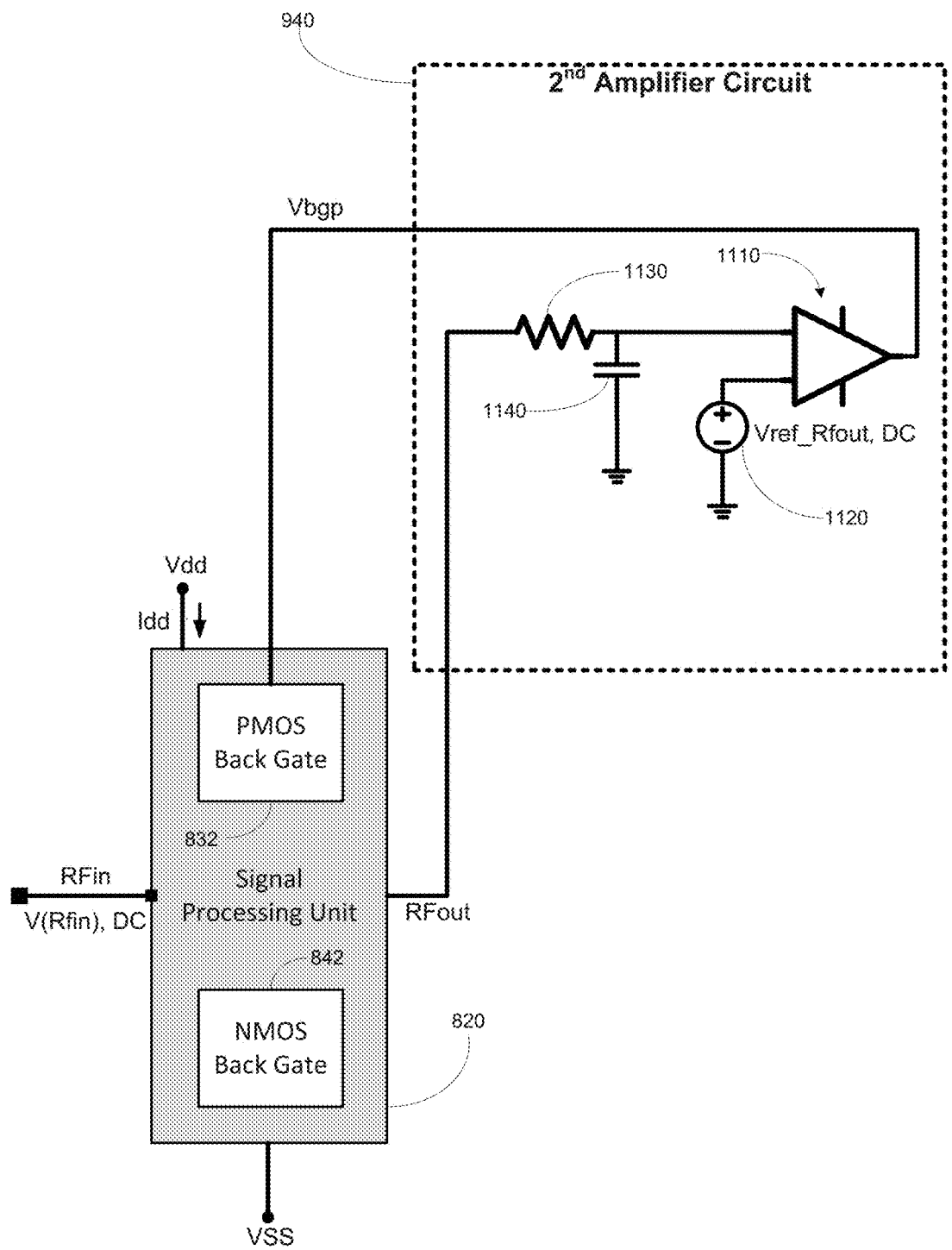
FIG. 11 illustrates a stylized block diagram of the $2^{nd}$ amplifier circuit of FIG. 9, in accordance with embodiments herein.

Turning now to FIG. 11, a stylized block diagram of the 2nd amplifier circuit of FIG. 9, in accordance with embodiments herein, is illustrated. The $2^{nd}$ amplifier circuit 840 comprises an amplifier 1110, which receives the output signal RFout from the signal processing unit 820. Therefore, a feedback adjustment of the PMOS transistor 830 is performed via the PMOS back gate 832. The amplifier 1010 may be a negative feedback circuit, gain element, or operation amplifier (op amp).

The output voltage, RFout is sent through an RC network comprising a resistor 130 and a capacitor 1140. The output of the RC network, along with a reference voltage signal Vref, represented by the voltage source 1120, is provided to the amplifier 1110. The output signal, Vgbp from the amplifier device 1110 also has a UGBW that is significantly less that the frequency of the input signal, RFin. The output signal (Vbgp), which is a bias signal for the PMOS transistor 840, is provided to the PMOS back gate 832.

The negative feedback elements of the amplifiers 1010, 1110 are configured to have low bandwidth that substantially prevents negative feedback at higher signal frequencies (e.g., RF frequencies) of the RFin 750/RFout755 signals. This configuration is provided so that the negative feedback do not hold the transistor current and voltage at a constant level, which would prevent any amplification.

In one embodiment, the bandwidth of the amplifier circuit 940 may be limited to below the RF passband. This limitation may be accomplished in a number of ways that are known to those skilled in the art having benefit of the present disclosure. For example, using the RC filter circuit (1130, 1140), limiting the bandwidth of the amplifier 1110 itself, providing an op-amp feedback RC filtering, input filtering, and/or using other means known to those skilled in the art having benefit of the present disclosure.

Figure 12:
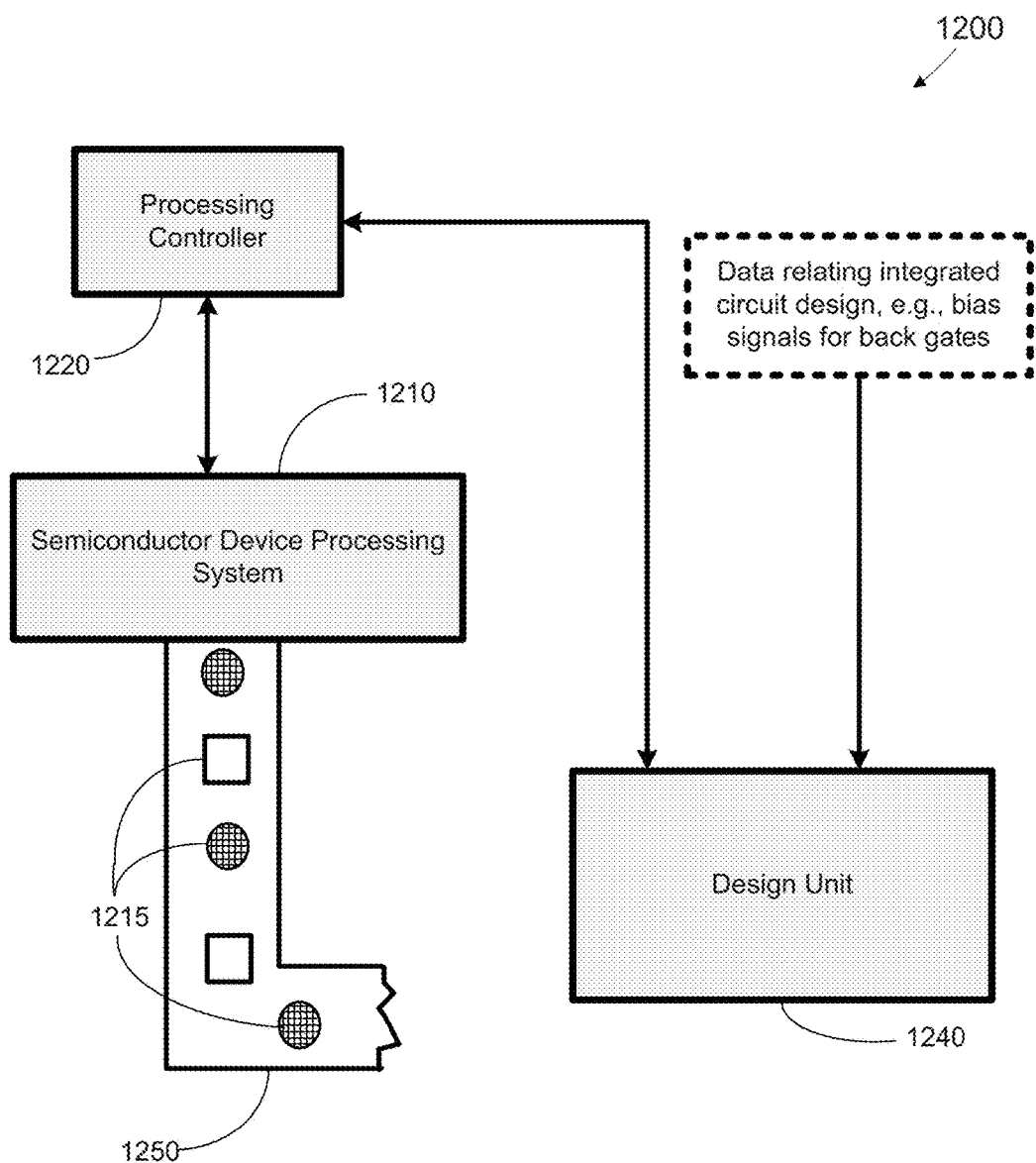
FIG. 12 illustrates a stylized depiction of a system for fabricating a device comprising FD SOI PMOS and NMOS devices, in accordance with some embodiments herein.

Turning now to FIG. 12, a stylized depiction of a system for fabricating a device comprising FD SOI PMOS and NMOS devices, in accordance with some embodiments herein, is illustrated. The semiconductor device processing system 1210 may comprise various processing stations, such as etch process stations, photolithography process stations, CMP process stations, etc. One or more of the processing steps performed by the processing system 1210 may be controlled by the processing controller 1220. The processing controller 1220 may be a workstation computer, a desktop computer, a laptop computer, a tablet computer, or any other type of computing device comprising one or more software products that are capable of controlling processes, receiving process feedback, receiving test results data, performing learning cycle adjustments, performing process adjustments, etc.

The semiconductor device processing system 1210 may produce integrated circuits on a medium, such as silicon wafers. The production of integrated circuits by the device processing system 1210 may be based upon the circuit designs provided by the integrated circuits design unit 1240. The processing system 1210 may provide processed integrated circuits/devices 1215 on a transport mechanism 1250, such as a conveyor system. In some embodiments, the conveyor system may be sophisticated clean room transport systems that are capable of transporting semiconductor wafers. In one embodiment, the semiconductor device processing system 1210 may comprise a plurality of processing steps, e.g., the $1^{st}$ process step, the $2^{nd}$ process set, etc., as described above.

In some embodiments, the items labeled "1215" may represent individual wafers, and in other embodiments, the items 1215 may represent a group of semiconductor wafers, e.g., a "lot" of semiconductor wafers. The integrated circuit or device 1215 may be a transistor, a capacitor, a resistor, a memory cell, a processor, and/or the like. In one embodiment, the device 1215 is a transistor and the dielectric layer is a gate insulation layer for the transistor.

The integrated circuit design unit 1240 of the system 1200 is capable of providing a RF circuit device design that may be manufactured by the semiconductor processing system 1210. The design unit 1240 may receive data relating to the design specifications for the integrated circuits to be designed, including parameters relating to transistors having back gate and front gate and bias signals for the back gates.

The design unit 1240 is capable of analyzing and performing design adjustments to provide, route, and implement forward and/or reverse biasing voltages. More particularly, the design unit 1240 may receive data relating the specifications for forming transistors comprising back gate and front gates. Further, the design unit 1240 may receive data relating to biasing voltage levels for biasing the back gates, operation voltage, threshold specifications, and/or current density specifications.

In other embodiments, the design unit 1240 may perform an automated determination of area that require design adjustments to provide, route, and implement forward and/or reverse biasing voltages and timing adjustments, and automatically incorporate design adjustments into the device design. For example, once a designer or a user of the integrated circuit design unit 1240 generates a design using a graphical user interface to communicate with the integrated circuit design unit 1240, the unit 1240 may perform automated modification of the design.

The system 1200 may be capable of performing analysis and manufacturing of various products involving various technologies. For example, the system 1200 may design and production data for manufacturing devices of CMOS technology, Flash technology, BiCMOS technology, power devices, controllers, processors, RF circuits, and/or various other semiconductor technologies.

Although in some examples, circuits herein were described in terms of FD SOI devices for consistency and ease of illustration, those skilled in the art would appreciate that concepts described herein may also apply to other SOI devices (e.g., partially depleted (PD) SOI devices) and remain within the scope of embodiments herein. The concepts and embodiments described herein may apply to a plurality of types of VT families of devices, including but limited to, FD SOI LVT transistors, FD SOI SLVT transistors, FD SOI RVT transistor, FD SOI HVT transistors, or combination herein, and remain within the scope of the embodiments herein.

The system 1100 may be capable of manufacturing and testing various products that include transistors with active and inactive gates involving various technologies. For example, the system 1100 may provide for manufacturing and testing products relating to CMOS technology, BiCMOS technology, power devices, processors, and/or various other types of integrated circuit devices (e.g., radio-frequency (RF) devices, system on chips that include RF and/or analog functionality, etc.).

The methods described above may be governed by instructions that are stored in a non-transitory computer readable storage medium and that are executed by, e.g., a processor in a computing device. Each of the operations described herein may correspond to instructions stored in a non-transitory computer memory or computer readable storage medium. In various embodiments, the non-transitory computer readable storage medium includes a magnetic or optical disk storage device, solid state storage devices such as flash memory, or other non-volatile memory device or devices. The computer readable instructions stored on the non-transitory computer readable storage medium may be in source code, assembly language code, object code, or other instruction format that is interpreted and/or executable by one or more processors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A semiconductor device, comprising:
    a signal processing unit for processing an input signal to provide an output signal, said signal processing unit comprising:
        a first transistor and a second transistor, wherein said first transistor comprises a first back gate and a first front gate; and
        said second transistor is operatively coupled to said first transistor, wherein said second transistor comprises a second back gate and a second front gate;
    a gain circuit for providing a gain upon said output signal; and
    a bias circuit to provide a first bias signal to said first back gate and a second bias signal to said second back gate, wherein said bias circuit comprises:
        a voltage divider circuit to provide a divided voltage signal;
        a current mirror for providing a current-proportional voltage signal based on said divided voltage signal;
        a first amplifier circuit configured to receive said current-proportional voltage signal and a current-reference voltage signal and provide said second bias signal; and
        a second amplifier circuit configured to receive said divided voltage signal and said output signal and provide said first bias signal.

2. The semiconductor device of claim 1, wherein said first transistor is a PMOS device and said second transistor is an NMOS device.

3. The semiconductor device of claim 2, wherein said first bias signal is a positive signal voltage signal and said second bias signal is a negative voltage signal.

4. The semiconductor device of claim 1, wherein said gain circuit is adapted to provide at least one of a unity gain and an amplification of said output signal.

5. The semiconductor device of claim 1, wherein said input signal is a radio-frequency signal.

6. The semiconductor device of claim 1, wherein the drain of said first transistor is electrically coupled to the drain of said second transistor, wherein an output signal node is coupled to said drain of said first transistor.

7. The semiconductor device of claim 1, wherein said second amplifier circuit comprises:
    an RC circuit at a first input, wherein said divided voltage signal is provided to said first input; and
    a second input, wherein said output signal is provided to said second input; and
    wherein the gain bandwidths of said first and second amplifier circuits are limited to below the radio frequency (RF) passband.

8. The semiconductor device of claim 1, wherein said current mirror comprises a current to voltage converter configured for converting a current signal into said current-proportional voltage signal.

9. The semiconductor device of claim 1, wherein said first and second transistors are at least one of an FD SOI transistor, wherein said FD SOI transistor is at least one of an FD SOI LVT transistor, an FD SOI SLVT transistor, an FD SOI RVT transistor, or an FD SOI HVT transistor.

10. A system, comprising:

a semiconductor device processing system to process a semiconductor wafer for manufacturing a semiconductor device, wherein semiconductor device processing system comprising:
- a design unit configured to provide parameter for manufacturing said semiconductor device comprising:
  - a signal processing unit for processing an input signal to provide an output signal, said signal processing unit comprising:
    - a first transistor and a second transistor, wherein said first transistor comprises a first back gate and a first front gate; and
    - said second transistor is operatively coupled to said first transistor, wherein said second transistor comprises a second back gate and a second front gate;
  - a gain circuit for providing a gain upon said output signal; and
  - a bias circuit to provide a first bias signal to said first back gate and a second bias signal to said second back gate, wherein said bias circuit comprises a voltage divider circuit to provide a divided voltage signal; a current mirror for providing a current-proportional voltage signal based on said divided voltage signal; a first amplifier circuit configured to receive said current-proportional voltage signal and a current-reference voltage signal and provide said second bias signal; and a second amplifier circuit configured to receive said divided voltage signal and said output signal and provide said first bias signal; and
- a processing controller operatively coupled to said semiconductor device processing system, said processing controller configured to control an operation of said semiconductor device processing system for manufacturing said semiconductor device.

11. The system of claim 10, wherein said second amplifier circuit comprises:
- an RC circuit at a first input, wherein said divided voltage signal is provided to said first input; and
- a second input, wherein said output signal is provided to said second input; and
- wherein said unity gain band widths of said first and second amplifier circuits are larger than the frequency of said input signal.

* * * * *